(12) United States Patent
Hsiao et al.

(10) Patent No.: US 12,418,010 B2
(45) Date of Patent: Sep. 16, 2025

(54) SEMICONDUCTOR PACKAGE WITH IMPROVED HEAT DISTRIBUTION

(71) Applicant: Taiwan Semiconductor Manufacturing Company, Ltd., Hsinchu (TW)

(72) Inventors: Tsung-Chieh Hsiao, Changhua County (TW); Chih Hsin Yang, Hsinchu County (TW); Liang-Wei Wang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 554 days.

(21) Appl. No.: 17/830,861

(22) Filed: Jun. 2, 2022

(65) Prior Publication Data

US 2023/0395586 A1 Dec. 7, 2023

(51) Int. Cl.
*H01L 25/00* (2006.01)
*H01L 23/00* (2006.01)
*H01L 23/48* (2006.01)
*H01L 25/065* (2023.01)

(52) U.S. Cl.
CPC ............ *H01L 25/50* (2013.01); *H01L 23/481* (2013.01); *H01L 24/08* (2013.01); *H01L 24/80* (2013.01); *H01L 25/0657* (2013.01); *H01L 2224/08145* (2013.01); *H01L 2224/80006* (2013.01); *H01L 2224/80895* (2013.01); *H01L 2224/80896* (2013.01); *H01L 2225/06541* (2013.01); *H01L 2225/06582* (2013.01); *H01L 2225/06589* (2013.01)

(58) Field of Classification Search
CPC ..... H10B 80/00; H01L 25/0657; H01L 25/50; H01L 25/0652; H01L 24/80; H01L 24/473; H01L 2224/80006; H01L 2225/06524; H01L 2225/06527; H01L 2225/06586
USPC ........................................................ 257/777
See application file for complete search history.

(56) References Cited

U.S. PATENT DOCUMENTS

| 5,313,094 | A | 5/1994 | Beyer |
| 9,293,437 | B2 | 3/2016 | Yu et al. |
| 9,496,196 | B2 | 11/2016 | Yu et al. |
| 11,233,035 | B2 | 1/2022 | Chen |
| 2006/0145356 | A1 | 7/2006 | Liu |
| 2010/0187683 | A1 | 7/2010 | Bakir |
| 2016/0056089 | A1* | 2/2016 | Taniguchi ......... H01L 21/30625 438/456 |
| 2019/0333893 | A1 | 10/2019 | Yu et al. |

FOREIGN PATENT DOCUMENTS

| CN | 105210185 A | 12/2015 |
| TW | 201032352 A | 9/2010 |
| TW | 202010047 A | 3/2020 |

* cited by examiner

*Primary Examiner* — Jasmine J Clark
(74) *Attorney, Agent, or Firm* — HAYNES AND BOONE, LLP

(57) ABSTRACT

A semiconductor structure and processes of forming the same are provided. A semiconductor structure according to the present disclosure includes a first die having a front surface and a back surface and a second die bonded to the back surface of the first die. The first die includes a plurality of trenches adjacent the back surface and the plurality of trenches are filled with a liquid.

20 Claims, 17 Drawing Sheets

SEMICONDUCTOR PACKAGE WITH IMPROVED HEAT DISTRIBUTION

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Three-dimensional (3D) packaging or chip stacking generally refers to stack and attach chips vertically to increase efficiency and make better use of available space. It can enable heterogeneous integration of several dies with different chip sizes and/or functionalities. An example of implementation of 3D packaging is a system on integrated chip (SoIC) device or a high performance computing (HPC) device. The dense packing and vertical integration create challenges in heat dissipation as accumulation of heat may reduce the performance. While existing 3D package structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
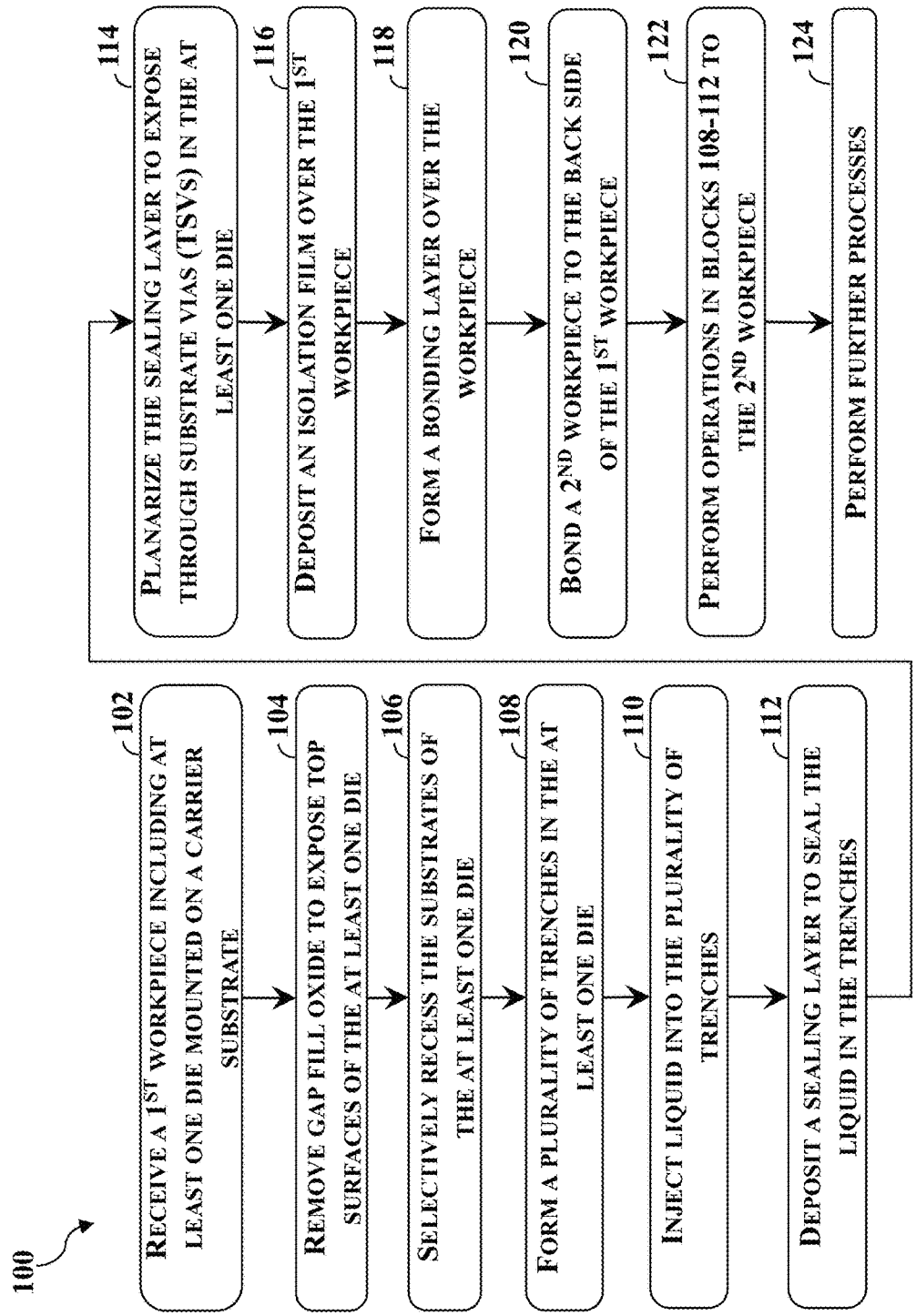
FIG. 1 is a flow chart illustrating an embodiment of a method of forming a package structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/–10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/–15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Three-dimensional (3D) packaging or chip stacking generally refers to stack and attach chips vertically to increase efficiency and make better use of available space. It enables heterogeneous integration of several dies with different chip sizes and/or functionalities. An example of implementation of 3D packaging is a system on integrated chip (SoIC) device or a high performance computing (HPC) device. Due to vertical integration, heat generated in a 3D package is dissipated mainly through conduction of the semiconductor substrates. Manufacture of 3D package structures includes steps to thin substrates of dies to reduce the resistance of through-substrate-vias (TSVs). Without substrate thinning, it can be difficult to satisfactorily fill the high-aspect-ratio TSV openings, resulting in voids that increase resistance. However, substrate thinning also reduces heat dissipation capabilities. Without sufficient heat dissipation, the performance of the 3D package may suffer. Additionally, high power density regions in the 3D package may form hot spots, which can locally reduce carrier mobility.

The present disclosure provides a package structure that increases heat dissipation through semiconductor substrates of dies in the package structure. According to the present disclosure, a plurality of trenches are formed in substrates of dies that are integrated in the package structure. The plurality of trenches are filled with a liquid or a highly thermally conductive metal. When the plurality of trenches are filled with a liquid, a sealing layer is deposited over the plurality of trenches to seal the liquid in the plurality of trenches. The inclusion of the liquid or the highly thermally conductive metal in the substrates increases the heat dissipating ability and improve heat distribution in the package structure.

The various aspects of the present disclosure will now be described in more detail with reference to the figures. In that regard, FIG. 1 is a flowchart illustrating a method 100 of forming a package structure that includes at least a first die and a second die, according to various aspects of the present disclosure. Method 100 is merely an example and is not intended to limit the present disclosure to what is explicitly illustrated in method 100. Additional steps can be provided before, during and after method 100, and some steps described can be replaced, eliminated, or moved around for additional embodiments of the method. Not all steps are described herein in detail for reasons of simplicity. Method 100 is described below in conjunction with FIG. 2-17, which are fragmentary cross-sectional views of a first workpiece 200 at different stages of fabrication according to various embodiments of method 100. For avoidance of doubts, the X, Y and Z directions in FIGS. 2-16 are perpendicular to one another. Throughout the present disclosure, unless expressly otherwise described, like reference numerals denote like features.

Figure 2:
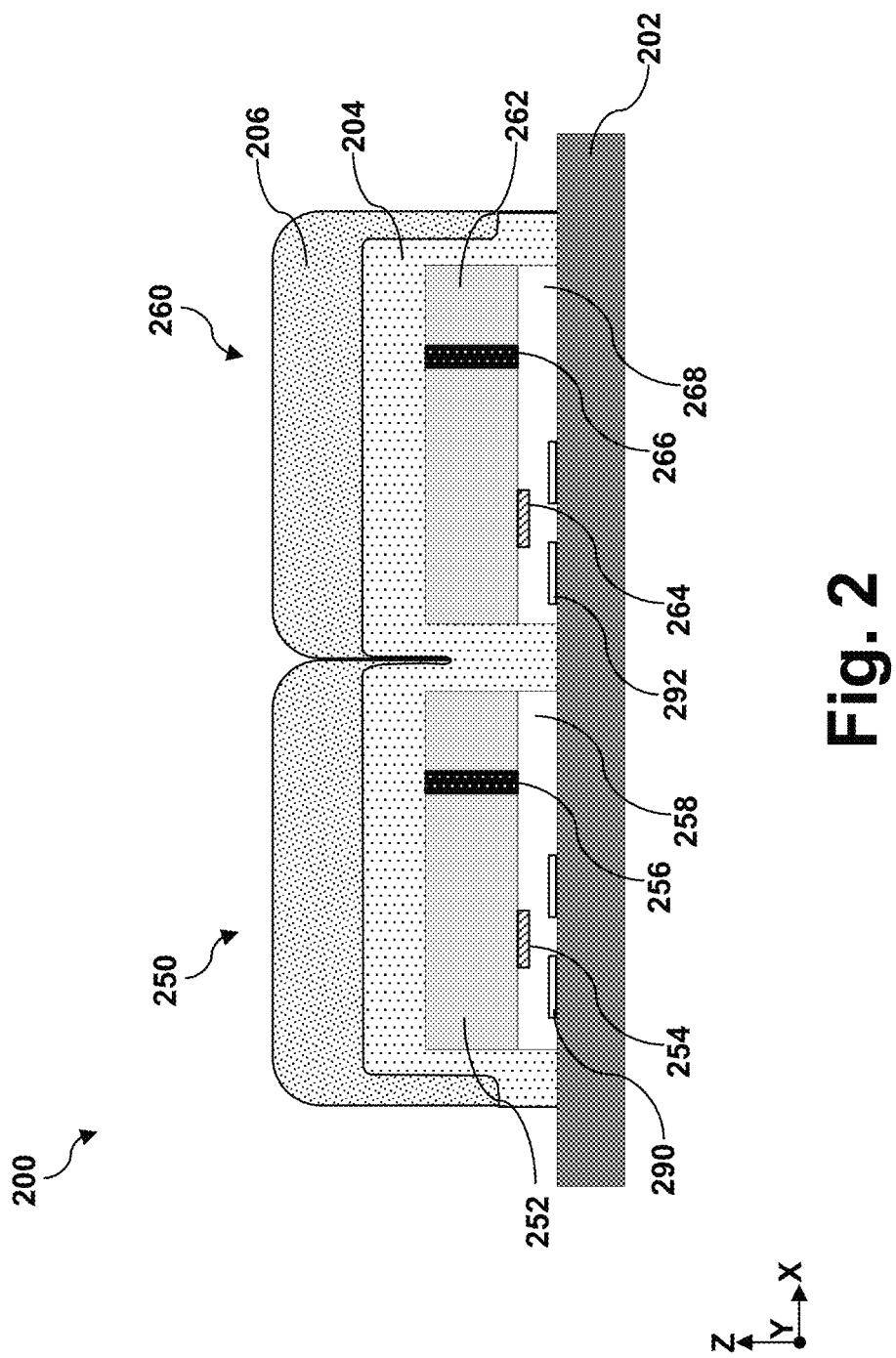
FIGS. 2-17 are fragmentary cross-sectional views of a workpiece undergoing operations of the method in FIG. 1, according to various aspects of the present disclosure.

Referring to FIGS. 1 and 2, method 100 includes a block 102 where a first workpiece 200 that includes a first die 250, a second die 260 and a gap fill layer 204 is received. In the embodiments represented in FIG. 2, the first workpiece 200 includes a first die 250 and a second die 260 mounted on a first carrier substrate 202. It should be understood that the first workpiece 200 shown in FIG. 2 is only an example and the first workpiece 200 may include only one die or more than two dies depending on the design needs. Each of the first die 250 and the second die 260 may be a logic die, a system-on-chip (SOC) die, a memory die (e.g., a dynamic random access memory (DRAM) die). The first die 250 includes a first substrate 252, a first transistor 254 formed on the first substrate 252, a first through substrate via (TSV) 256 extending through the first substrate 252, and a first interconnect structure 258. The first interconnect structure 258 is disposed on a front surface of the first substrate 252 and the first die 250 is flipped upside down to be mounted on the first carrier substrate 202. It is noted that the first die 250 includes more transistors than just the first transistor 254 and more TSVs than just the first TSV 256. For ease of illustration and explanation, figures of the present disclosure only show the first transistor 254 and the first TSV 256. Similarly, the second die 260 includes a second substrate 262, a second transistor 264 formed on the second substrate 262, a second through substrate via (TSV) 266 extending through the second substrate 262, and a second interconnect structure 268. The second interconnect structure 268 is disposed on a front surface of the second substrate 262 and the second die 260 is flipped upside down to be mounted on the first carrier substrate 202. It is noted that the second die 260 includes more transistors than just the second transistor 264 and more TSVs than just the second TSV 266. For ease of illustration and explanation, figures of the present disclosure only show the second transistor 264 and the second TSV 266.

In some embodiments, both the first substrate 252 and the second substrate 262 include silicon (Si). Alternatively, the first substrate 252 and the second substrate 262 may include a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), GaAsP, AlInAs, AlGaAs, GaInAs, GaInP, and/or GaInAsP; or combinations thereof. Alternatively, the first substrate 252 and the second substrate 262 may be semiconductor-on-insulator substrates, such as a silicon-on-insulator (SOI) substrates, silicon germanium-on-insulator (SGOI) substrates, or germanium-on-insulator (GeOI) substrates. Semiconductor-on-insulator substrates can be fabricated using separation by implantation of oxygen (SIMOX), wafer bonding, and/or other suitable methods. Both the first substrate 252 and the second substrate 262 can include various doped regions (not shown) depending on design requirements. In some implementations, the first substrate 252 and the second substrate 262 include p-type doped regions (for example, p-type wells) doped with p-type dopants, such as boron (for example, $BF_2$), indium, other p-type dopant, or combinations thereof as well as n-type doped regions (for example, n-type wells) doped with n-type dopants, such as phosphorus (P), arsenic (As), other n-type dopant, or combinations thereof. The various doped regions can be formed directly on and/or in the first substrate 252 and the second substrate 262, for example, to provide a p-well structure, an n-well structure, a dual-well structure, a raised structure, or combinations thereof. An ion implantation process, a diffusion process, and/or other suitable doping process can be performed to form the various doped regions.

The first transistor 254 and the second transistor 264 may be planar transistors or multi-gate transistors, such as fin-like field effect transistors (FinFETs) or gate-all-around (GAA) transistors. A planar transistor includes a gate structure that may induce a planar channel region along one surface of its active region, hence its name. A FinFET includes a fin-shaped active region arising from a substrate and a gate structure disposed over a top surface and sidewalls of the fin-shaped active region. A GAA transistor includes at least one channel member extending between two source/drain features and a gate structure that wraps completely around the at least one channel member. Because its gate structure wraps around the channel member, a GAA transistor may also be referred to as a surrounding gate transistor (SGT). Depending on the shapes and orientation, a channel member in a GAA transistor may be referred to as a nanosheet, a semiconductor wire, a nanowire, a nanostructure, a nano-post, a nano-beam, or a nano-bridge. In some instances, a GAA transistor may be referred to by the shape of the channel member. For example, a GAA transistor having one or more nanosheet channel member may also be referred to as a nanosheet transistor or a nanosheet FET.

Referring still to FIG. 2, the first interconnect structure 258 and the second interconnect structure 268 may each include eight (8) to nineteen (19) metal layers. Each of the metal layers may include an etch stop layer (ESL) and an intermetal dielectric (IMD) layer disposed on the ESL. The ESL may include silicon carbide, silicon nitride or silicon oxynitride. The IMD layers may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide. Each of the metal layers includes a plurality of vertically extending vias and horizontally metal lines. The first interconnect structure 258 includes first top metal features 290 of the surface adjacent the first carrier substrate 202. The second interconnect structure 268 include second top metal features 292 adjacent the surface adjacent to the first carrier substrate 202. The first top metal features 290 and the second top metal features 292 may also be referred to as first contact pads 290 and second contact pads 292, respectively. The contact vias, metal lines in the first interconnect structure 258 and the second interconnect structure 268 may include copper (Cu), tantalum (Ta), nickel (Ni), cobalt (Co), aluminum (Al), or a combination thereof. In one embodiment, the contact vias and metal lines include copper (Cu). The top metal features (i.e., 290 and 292) may include copper (Cu), aluminum (Al), or an alloy thereof. In one embodiment, the top metal features (i.e., 290 and 292) may include an alloy of aluminum and copper. While not explicitly shown, the contact vias, metal lines and top metal features may further include a barrier layer to interface the oxygen-containing IMDs. The barrier layer may include titanium nitride (TiN), tantalum nitride (TaN), manganese nitride (MnN), or other transition metal nitride.

In some embodiments represented in FIG. 2, the first TSV 256 extends through the first substrate 252 and the second TSV 266 extends through the second substrate 262. The first TSV 256 and the second TSV 266 may include copper (Cu), tantalum (Ta), nickel (Ni), cobalt (Co), aluminum (Al), or a combination thereof. In one embodiment, the first TSV 256 and the second TSV 266 include copper (Cu) and may be formed using an electroplating process. In an example process, a seed layer is first deposited using physical vapor deposition (PVD) or chemical vapor deposition (CVD) and then a metal fill layer is deposited using electroplating. While not explicitly shown in the figures, a barrier layer may be formed to space the metal fill layer of the first TSV 256 and the second TSV 266 from the ESLs and IMDs in the first interconnect structure 258 or the second interconnect structure 268. The barrier layer may include titanium nitride (TiN), tantalum nitride (TaN), manganese nitride (MnN), or other transition metal nitride.

As shown in FIG. 2, the first workpiece 200 may also include a gap fill layer 204 and a photoresist layer 206 over the gap fill layer 204. The gap fill layer 204 functions to fill gaps between the first die 250 and the second die 260 as well as around the first die 250 and the second die 260. The photoresist layer 206 may be used to selectively remove the gap fill layer 204 over the first die 250 and the second 260 to prevent formation of uneven surfaces during subsequent planarization processes. In some embodiments, the gap fill layer 204 includes silicon oxide and may be deposited using chemical vapor deposition (CVD), flowable CVD (FCVD), or spin-on coating. The first carrier substrate 202 may include silicon or glass. As will be described further below, the first carrier substrate 202 may be removed at a later stage and will not become part of the final package structure.

Figure 3:
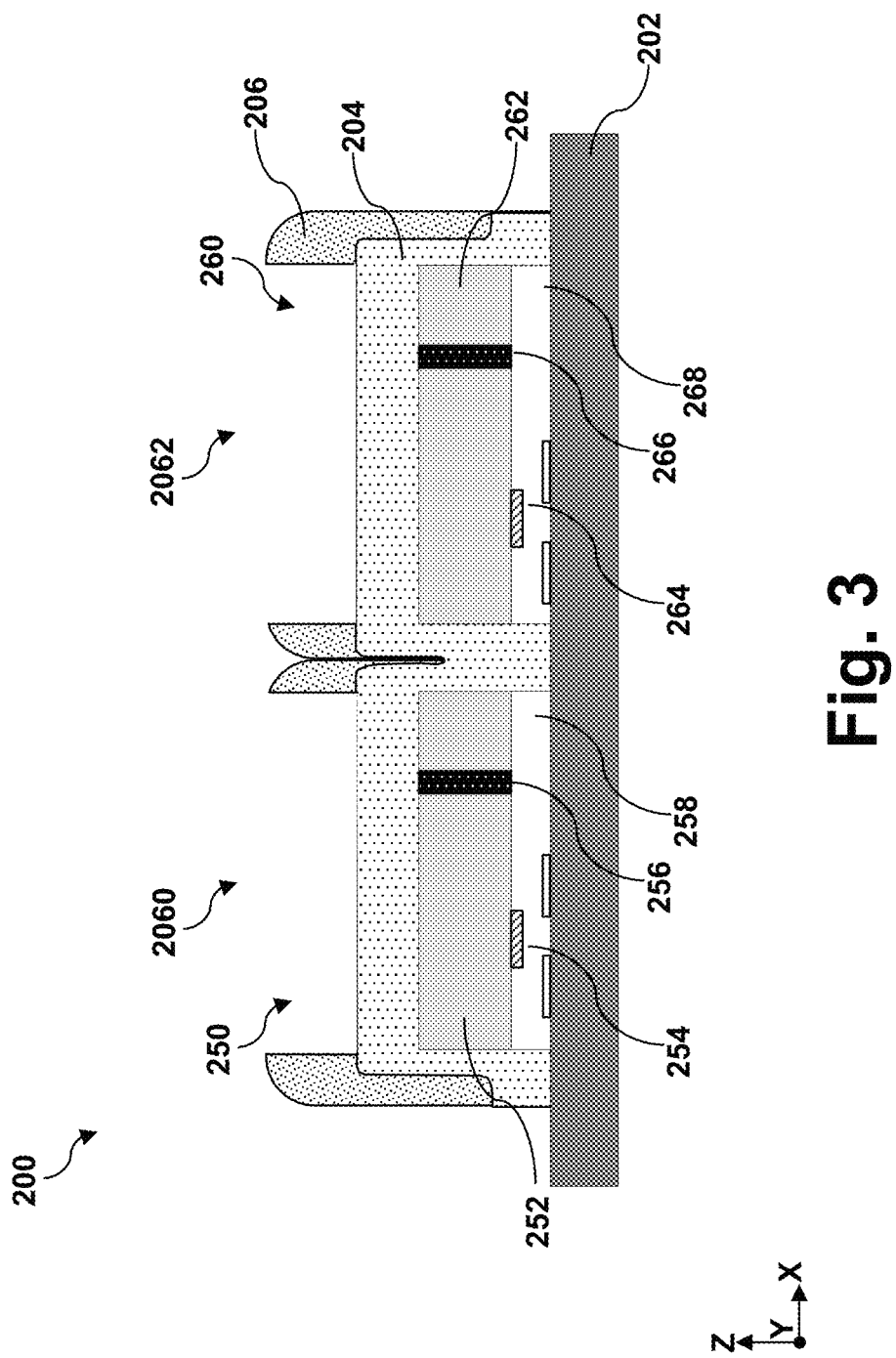
Figure 4:
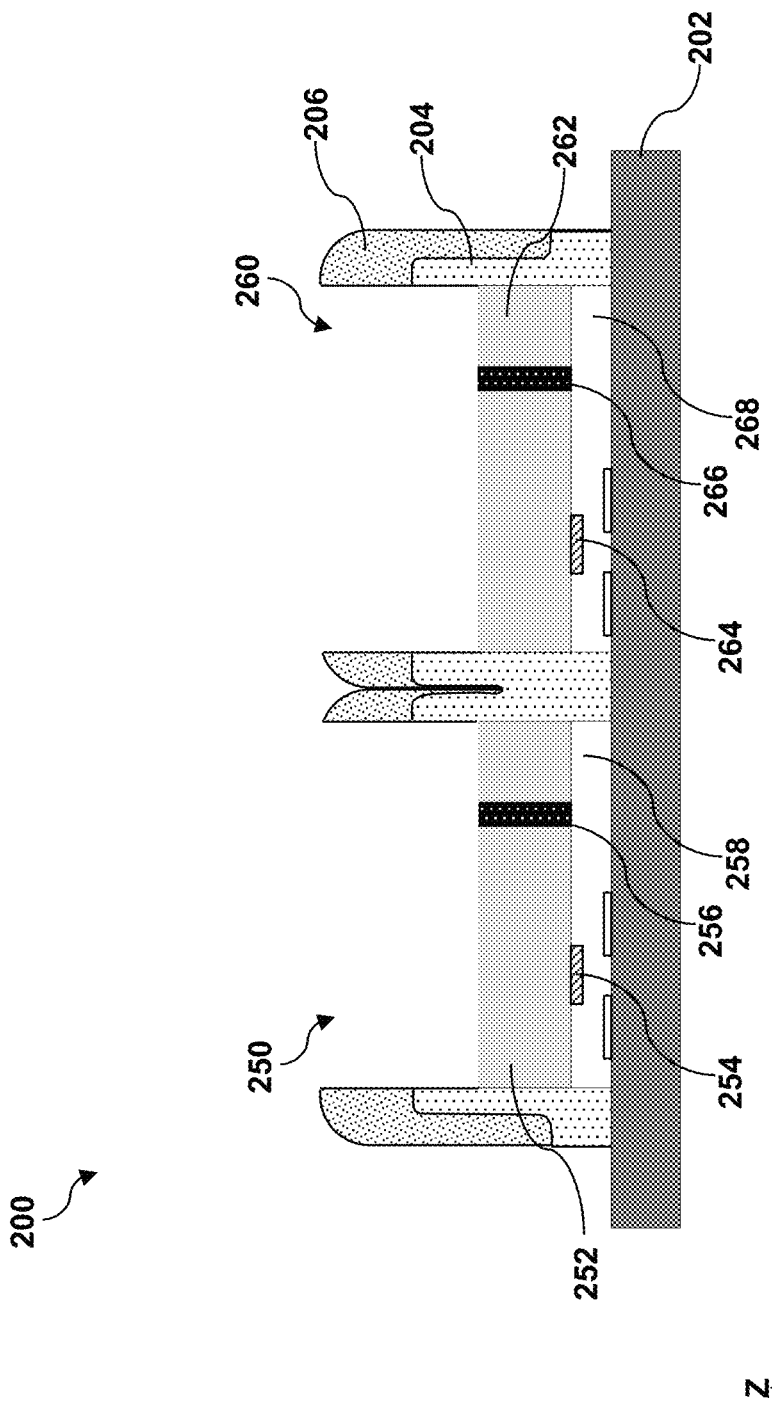
Figure 5:
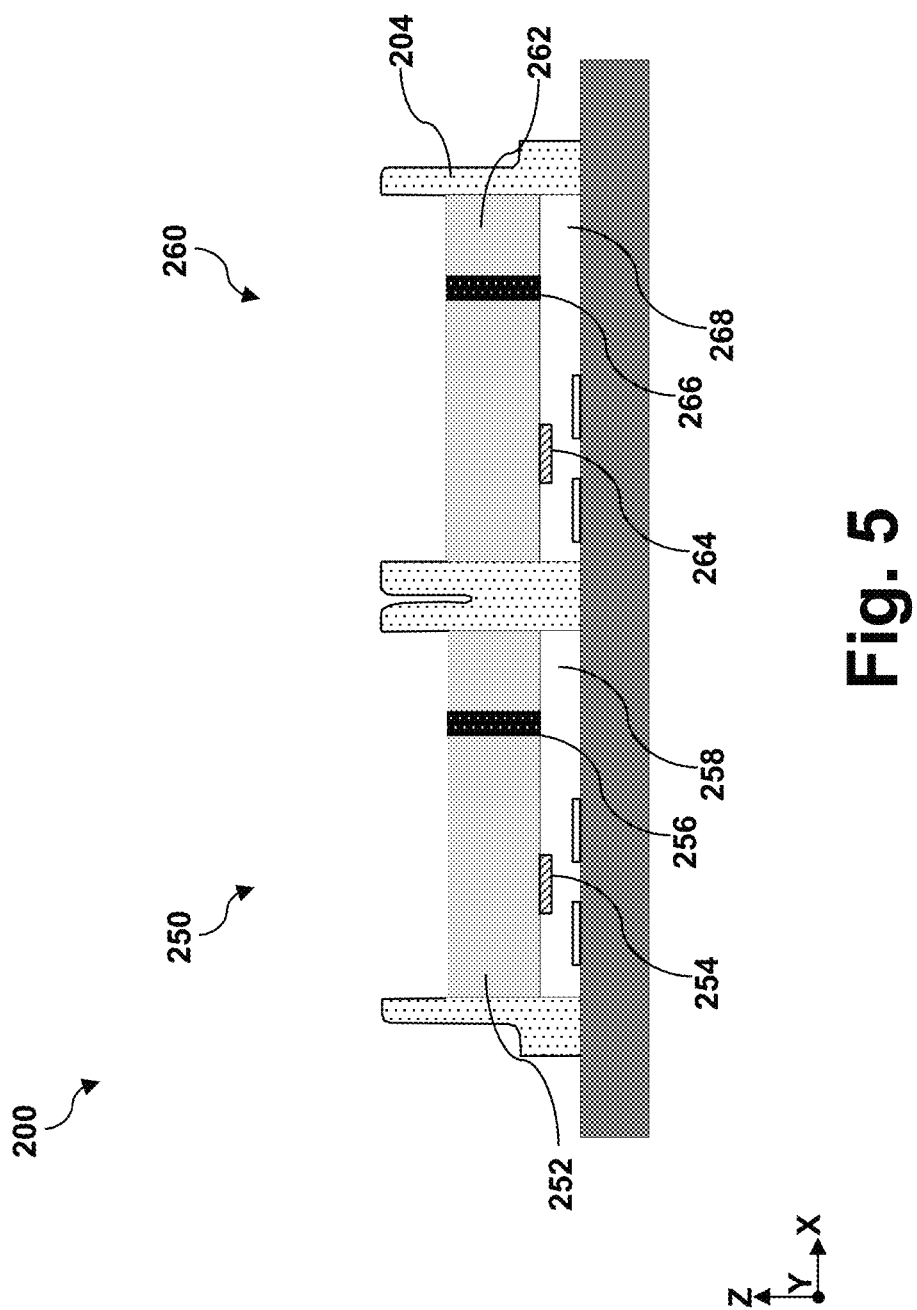
Figure 6:
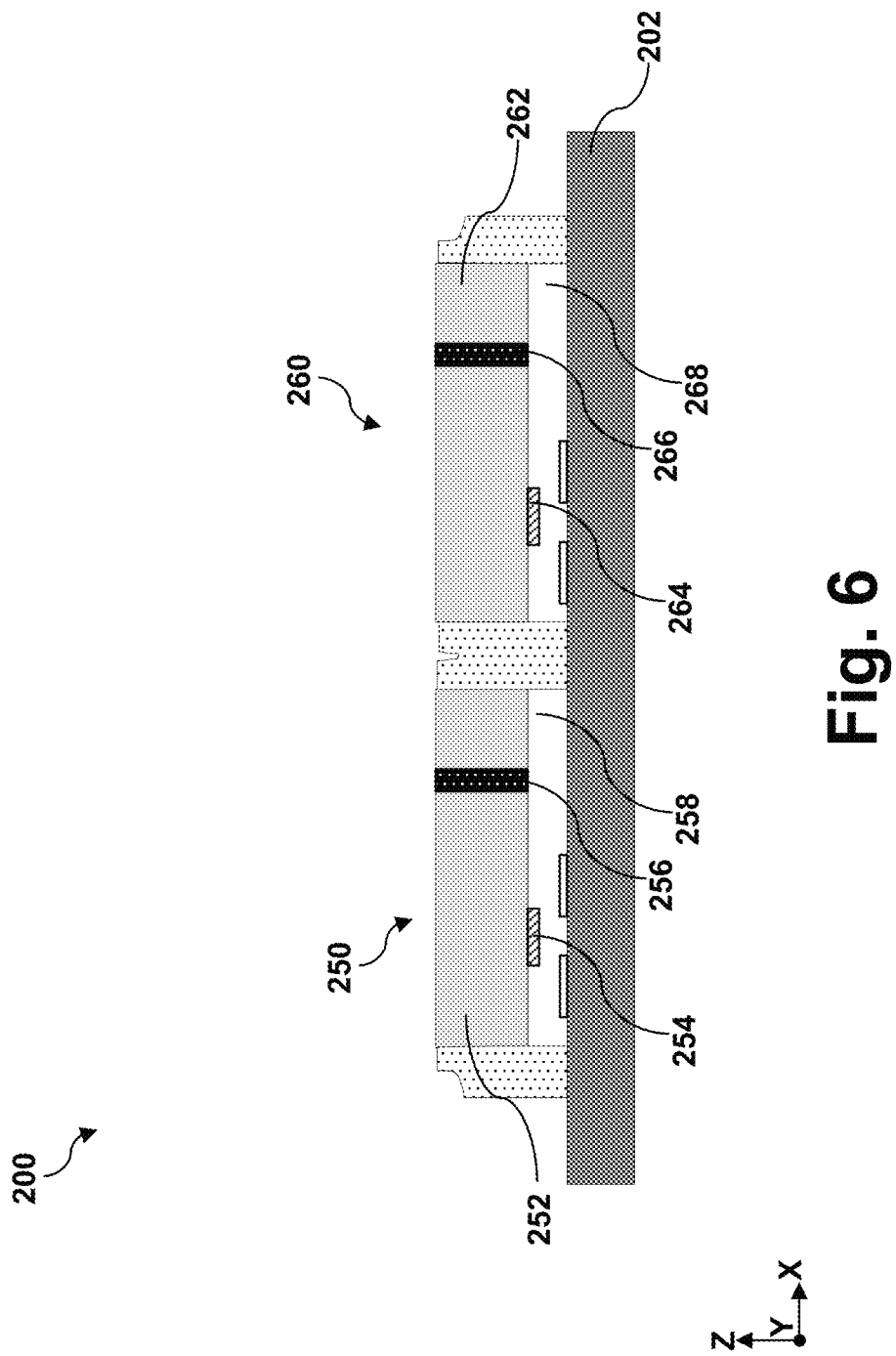

Referring to FIGS. 1 and 3-6, method 100 includes a block 104 where the gap fill layer 204 is removed from surfaces of the first die 250 and the second die 260. Block 104 includes multiple steps to remove the gap fill layer 204 over the first die 250 and the second 260 without forming recesses in the remaining gap fill layer 204. Block 104 first patterns the photoresist layer 206 using photolithography. In an example process, the photoresist layer 206 may undergo an pre-exposure baking process, exposure to radiation reflected from or transmitted through a photomask, a post-exposure baking process, and developing process, so as to form a patterned photoresist layer 206 as shown in FIG. 3. The patterned photoresist layer 206 includes a first opening 2060 that exposes the gap fill layer 204 directly over the first die 250 and a second opening 2062 that exposes the gap fill layer 204 directly over the second die 260. Referring then to FIG. 4, the patterned photoresist layer 206 is applied as an etch mask to etch the gap fill layer 204. As shown in FIG. 4, the etching of the gap fill layer 204 is performed until the first substrate 252 of the first die 250 and the second substrate 262 of the second die 260 are exposed. The etch process of the gap fill layer 204 may be a dry etch process that includes use of an inert gas (e.g., Ar) a fluorine-containing gas (e.g., $CF_4$, $C_2F_6$, $SF_6$ or $NF_3$), other suitable gases and/or plasmas, and/or combinations thereof. After the etching of the gap fill layer 204, the patterned photoresist layer 206 may be removed by ashing or selective etching, as shown in FIG. 5. After the removal of the patterned photoresist layer 206, the first workpiece 200 is planarized using, for example, a chemical mechanical polishing (CMP) process, to provide a substantial planar top surface, as shown in FIG. 6. It is noted that because the planarization process tends to remove the gap fill layer 204 faster than it does the first substrate 252 or the second substrate 262, performing a planarization directly to the first workpiece 200 shown in FIG. 2 may result in recesses between and around the first die 250 and the second die 260. That is why block 104 includes the aforementioned steps to planarize the first workpiece 200.

Figure 7:
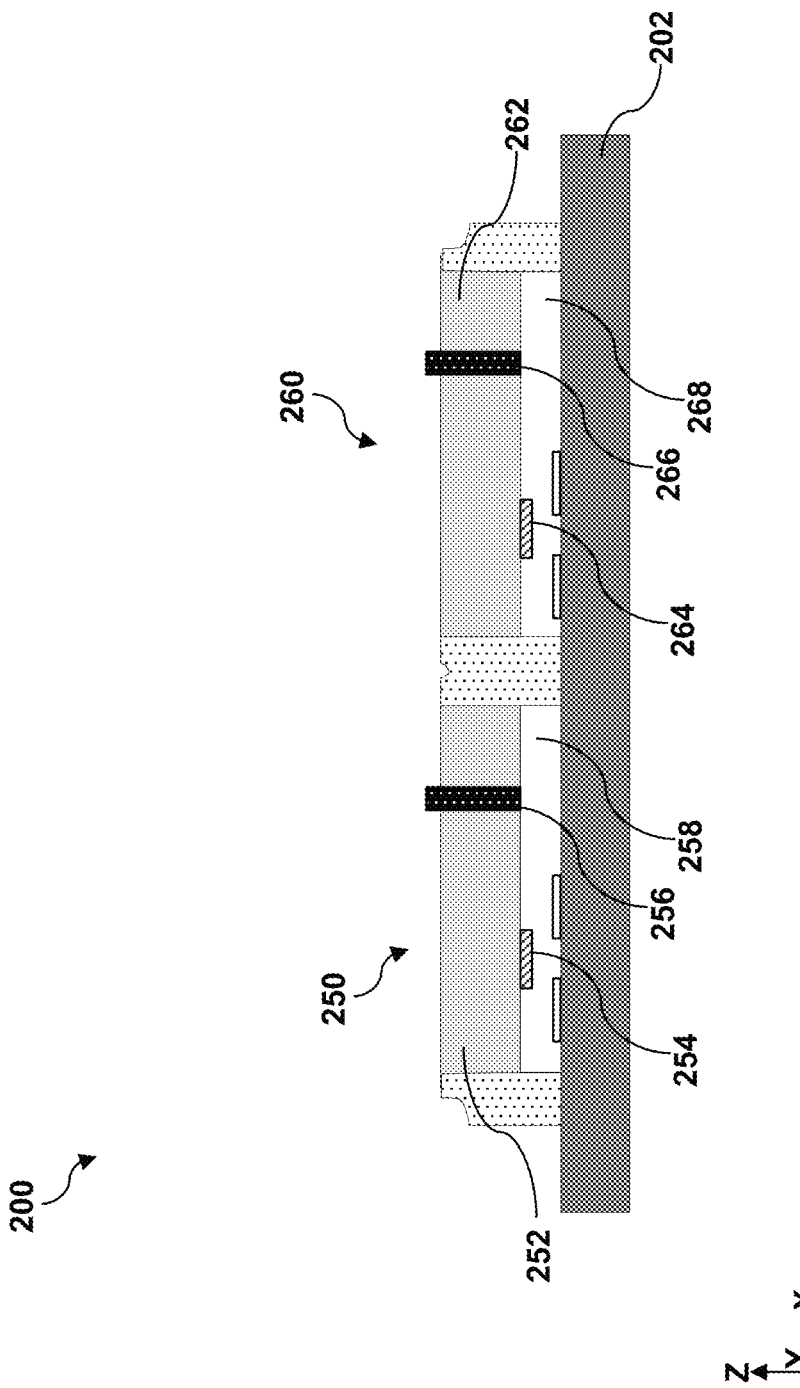

Referring to FIGS. 1 and 7, method 100 includes a block 106 where a first substrate 252 and a second substrate 262 are selectively recessed. In some embodiments, the selective recessing may be implemented by a dry etch process that includes use of oxygen-containing gas (e.g., $O_2$), an inert gas (e.g., Ar) a fluorine-containing gas (e.g., $CF_4$, $C_2F_6$, $SF_6$ or $NF_3$), other suitable gases and/or plasmas, and/or combinations thereof. As shown in FIG. 7, the selective recessing is performed until top portions of the first TSV 256 and the second TSV 266 rise above top surfaces of the first substrate 252 and the second substrate 262. As shown in FIG. 7, the gap fill layer 204 may be recessed along with the first substrate 252 and the second substrate 262.

Figure 8:
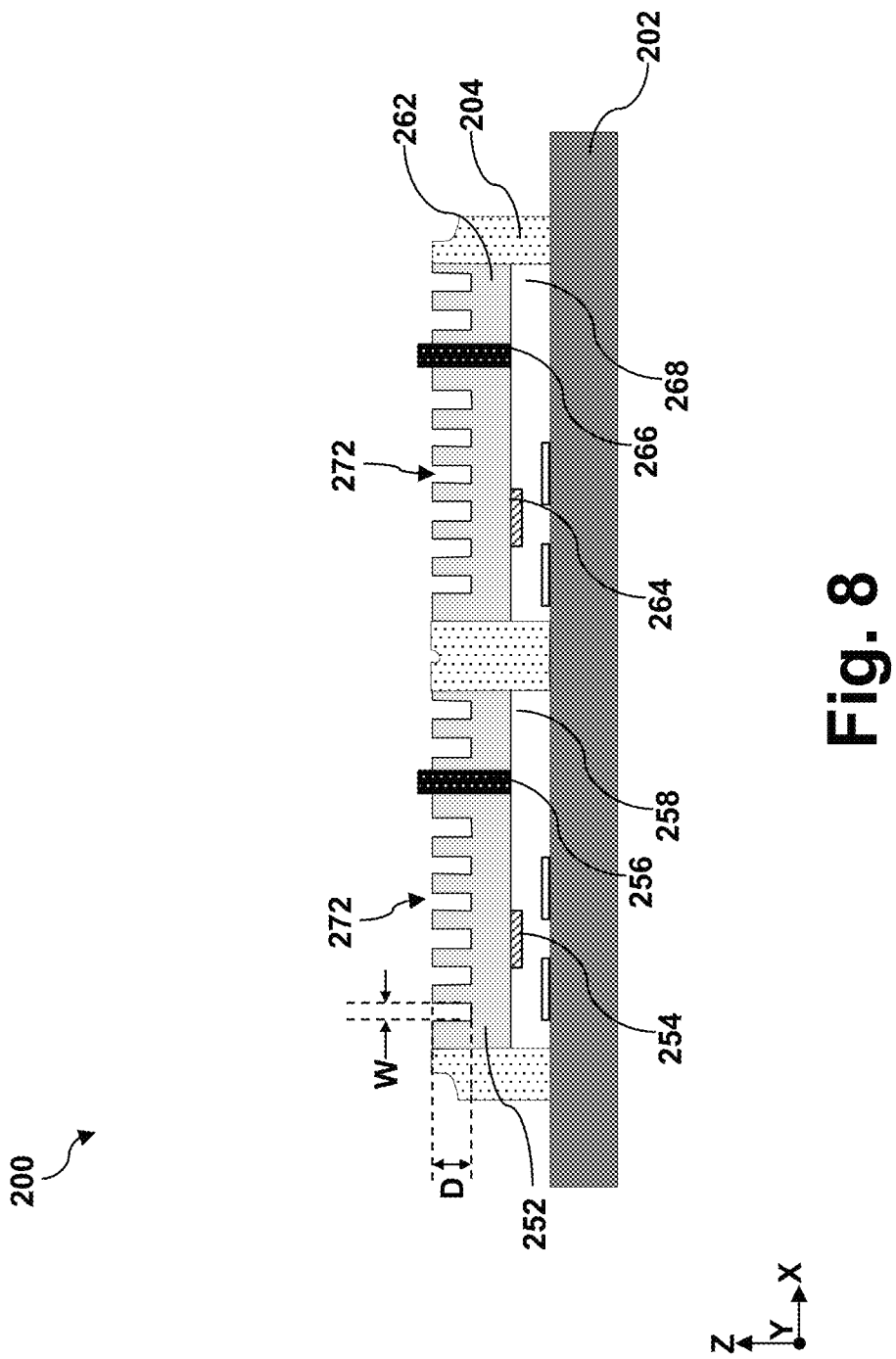

Referring to FIGS. 1 and 8, method 100 includes a block 108 where a plurality of trenches 272 are formed in the first substrate 252 and the second substrate 262. Each of the plurality of trenches 272 may include a width W along the X direction and a depth D along the Z direction (i.e., the vertical direction). In some embodiments, the depth D may be between about 1 μm and about 500 μm. The width W of the trenches 272 may have a wide range, depending on the space available for the trenches 272 and how the trenches 272 are formed. The plurality of trenches 272 may be formed using a mechanical dicing saw, a laser dicing saw, or a dry etch process. In the depicted embodiments, the first die 250 and the second 260 are square or rectangular in shape from a top view (i.e., along the Z direction) and may have a width along the Y direction. The trenches 272 in FIG. 8 also extend lengthwise along the Y direction. The length of the trenches 272 extends a portion of the width of the first die 250 and the second die 260. In some embodiments, one or more of the trenches 272 may extend substantially the entire width of the first die 250 and the second die 260. That is, one or more of the plurality of trenches 272 may traverse or span substantially the entire Y-direction width of the first die 250 and the second die 260.

Figure 9:
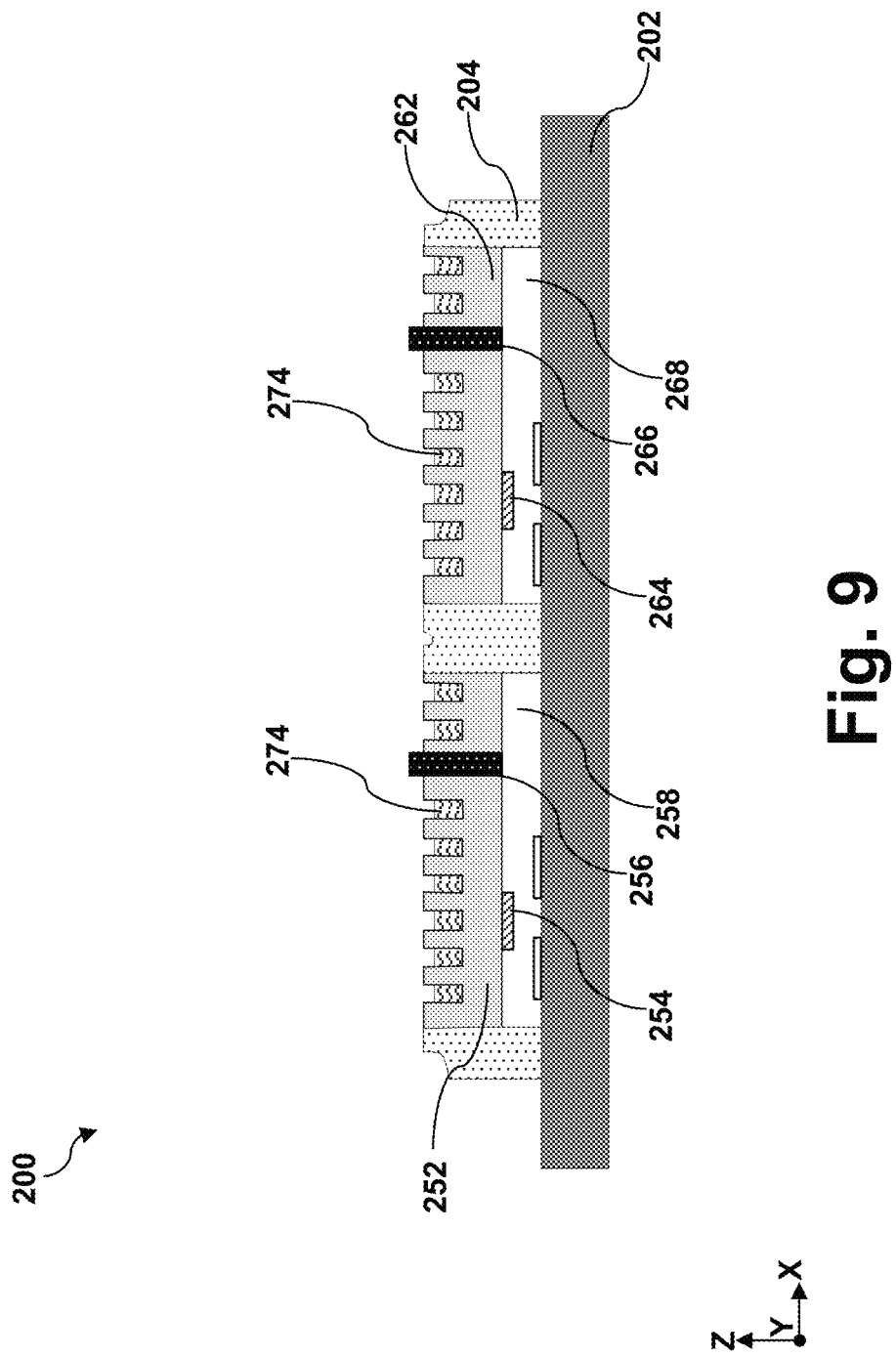

Referring to FIGS. 1 and 9, method 100 includes a block 110 where a liquid 274 is injected into the plurality of trenches 272. In some embodiments, the liquid 274 is water. In some alternative embodiments, the liquid 274 may be a liquid suitable for high heat flux immersion cooling. In these alternative embodiments, the liquid 274 includes several attributes that make it suitable for use in the semiconductor structure of the present disclosure. For example, the liquid 274 is dielectric and has low dielectric constant to prevent leakage and parasitic capacitance. In some instances, the liquid 274 may have low surface tension so it can better wet the surfaces of the trenches 272. A suitable liquid 274 should also have high boiling point or low vapor pressure to prevent device damage due to high vapor pressure. Examples of the liquid 274 for these alternative embodiments may include hydrocarbons or fluorocarbons. Example hydrocarbons include polyether. Example fluorocarbons include perfluoropolyether (PFPE) and 1-butyl-3-methylimidazolium hexafluorophosphate (BMIM-$PF_6$). At block 110, the liquid 274 may be atomized and injected over the first workpiece 200 to fill the trenches 272. Alternatively, the liquid 274 may be deposited over the trenches 272 using spin-on coating. In some alternative embodiments, the liquid 274 is replaced with a highly thermally conducive metal, such as aluminum (Al). When a highly thermally conductive metal is used instead of the liquid 274, the metal may be deposited using atomic layer deposition physical vapor deposition (PVD) or CVD.

Figure 10:
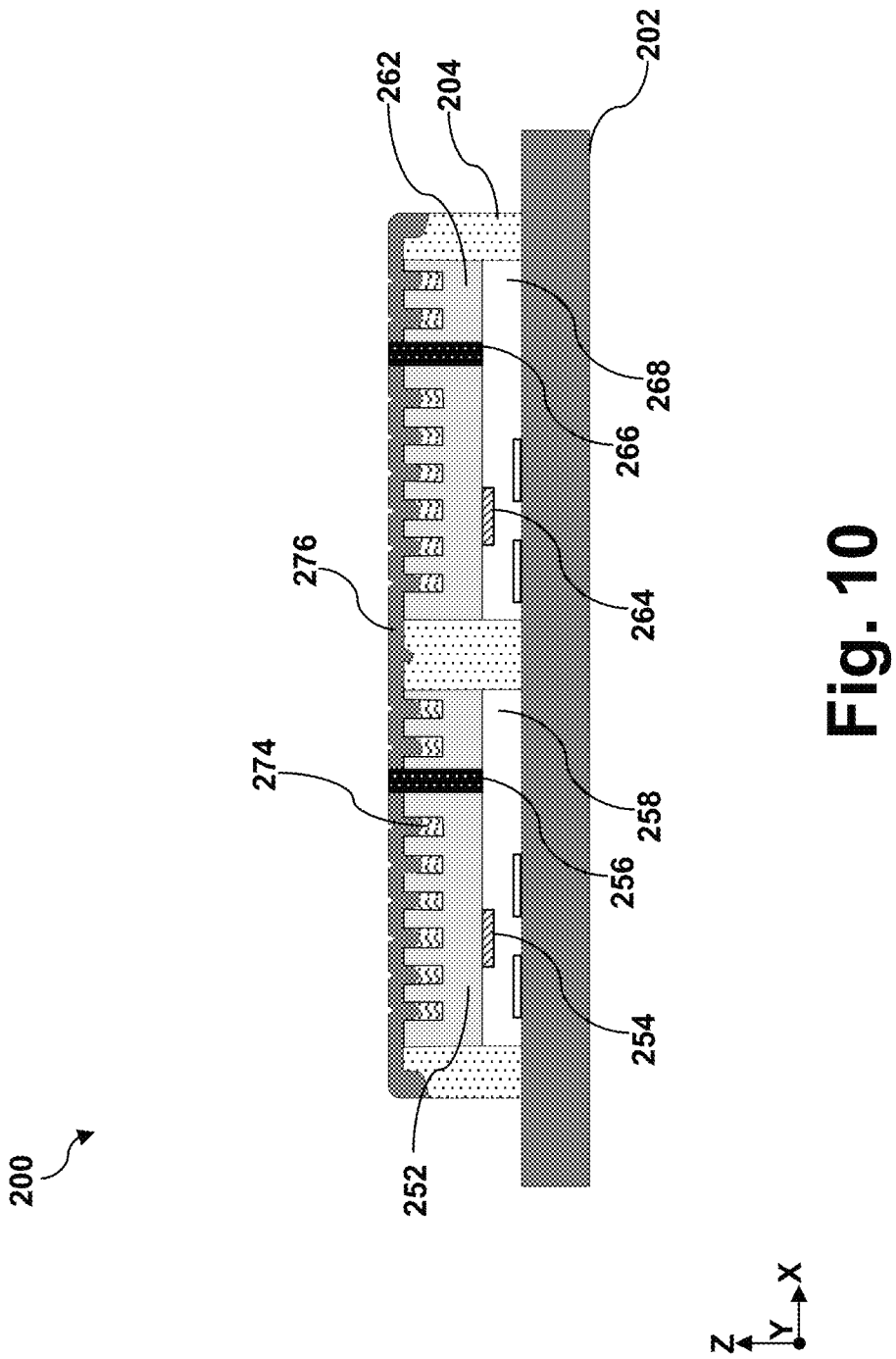

Referring to FIGS. 1 and 10, method 100 includes a block 112 where a sealing layer 276 is deposited over the first workpiece 200 to seal the liquid 274 in the trenches 272. In some embodiments, the sealing layer 276 may include silicon, silicon nitride, or silicon oxide. In one embodiment, the sealing layer 276 includes silicon nitride. The sealing layer 276 may be deposited using ALD, CVD, or flowable CVD (FCVD). When a highly thermally conductive metal is used at block 110 instead, operations at block 112 may be omitted. After the deposition of the sealing layer 276, the first TSV 256 and the second TSV 266 may be completely covered by the sealing layer 276.

Figure 11:
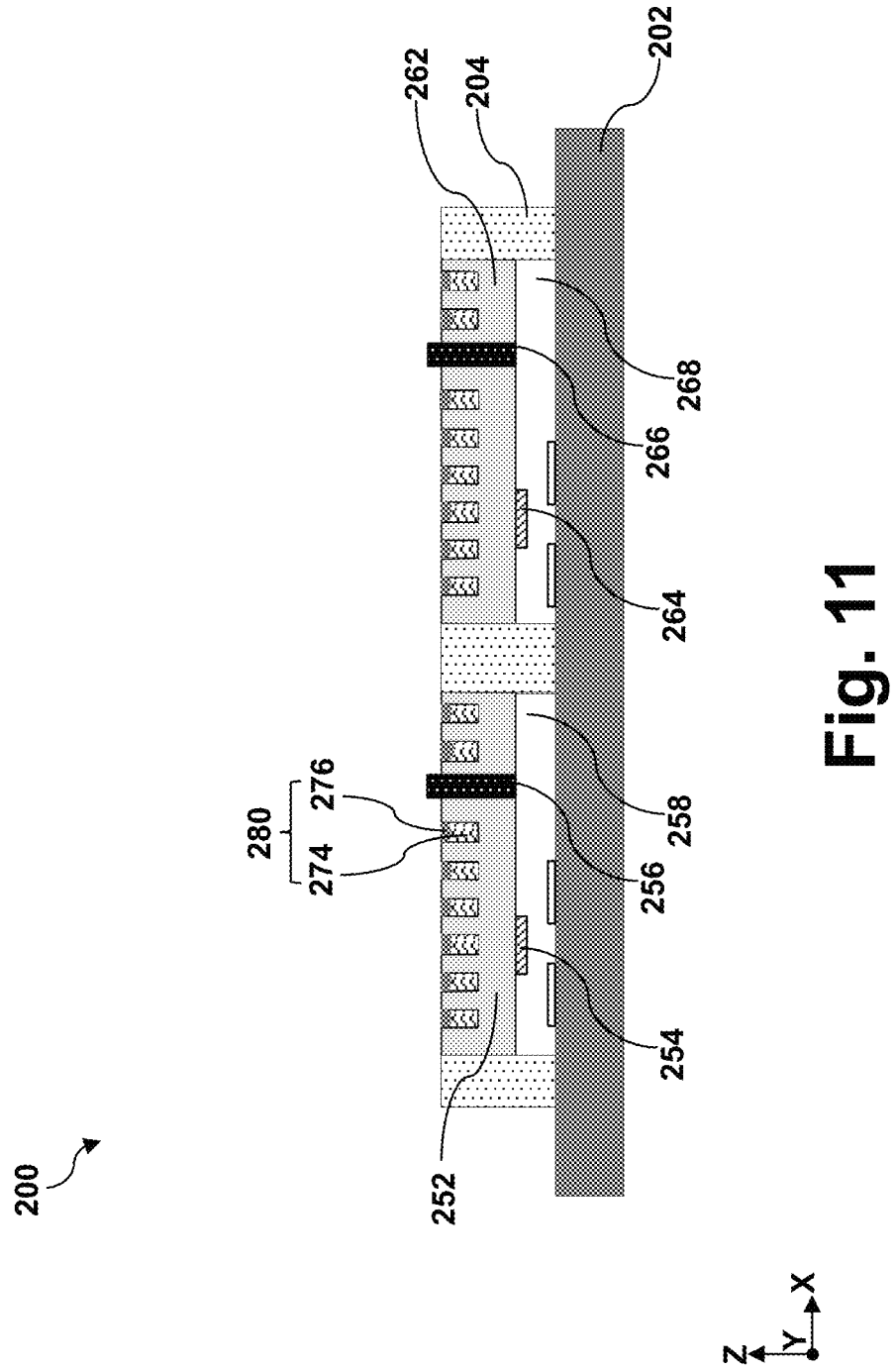

Referring to FIGS. 1 and 11, method 100 includes a block 114 where the sealing layer 276 is planarized to expose a portion of the first TSV 256 and the second TSV 266. At block 114, the first workpiece 200 is planarized to remove excess sealing layer 276 until the sealing layer 276 over top surfaces of the first substrate 252 and second substrate 262 is removed and the first TSV 256 and the second TSV 266 partially rise over the sealing layer 276. As shown in FIG. 11, upon conclusion of block 114, the plurality trenches 272 are substantially filled with the liquid 274 and the sealing layer 276. The sealing layer 276 and the liquid 274 sealed in the trenches 272 by the sealing layer 276 may be collectively referred to as first heat distribution features 280. In some embodiments represented in FIG. 11, because the planarization process may remove the first substrate 252, the second substrate 262, and the sealing layer 276 faster than it does the first TSV 256 and the second TSV 266, top portion of the first TSV 256 and the second TSV 266 may rise above the top planar surface of the workpiece 200 in FIG. 11. When the liquid 274 is replaced with a highly thermally conductive metal in the alternative embodiments, the plurality of trenches 272 are substantially filled with the metal to form the first heat distribution features 280.

Figure 12:
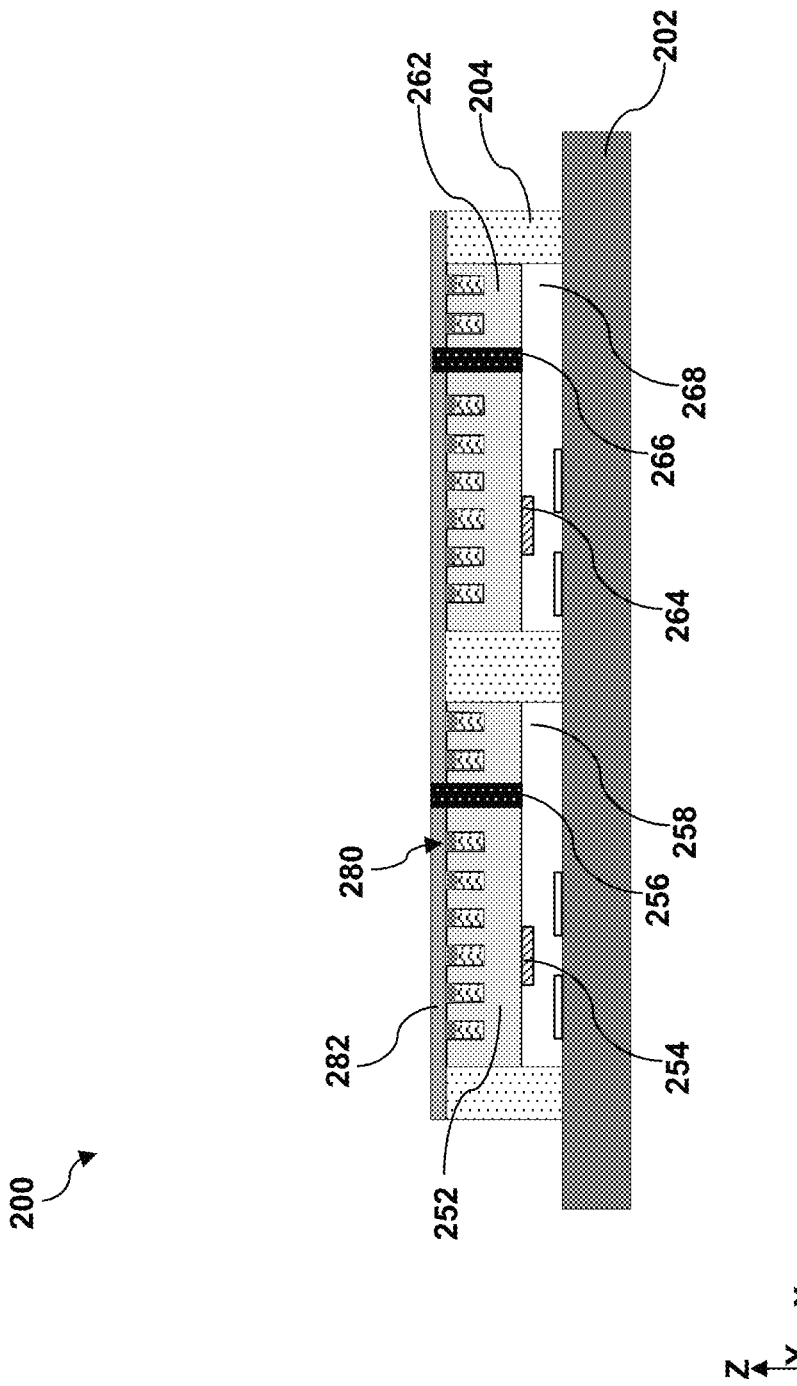

Referring to FIGS. 1 and 12, method 100 includes a block 116 where an isolation layer 282 is form over the first workpiece 200. Operation at block 116 includes deposition of the isolation layer 282 over the first workpiece 200 and planarization of the isolation layer 282 to expose top surfaces of the first TSV 256 and the second TSV 266. In some embodiments, the isolation layer 282 may include silicon nitride, silicon oxide, silicon oxynitride, or silicon oxycarbonitride. In the depicted embodiment, the isolation layer 282 includes silicon nitride. The isolation layer 282 may be conformally deposited using CVD or a suitable method. After the deposition of the isolation layer 282, the isolation layer 282 may be disposed on sidewalls and tops surfaces of the first TSV 256 and the second TSV 266. The deposited isolation layer 282 is then planarized using a chemical mechanical polishing (CMP) process. As shown in FIG. 12, after the planarization, top surfaces of the first TSV 256 and the second TSV 266 are exposed and substantially coplanar with a top surface of the isolation layer 282.

Figure 13:
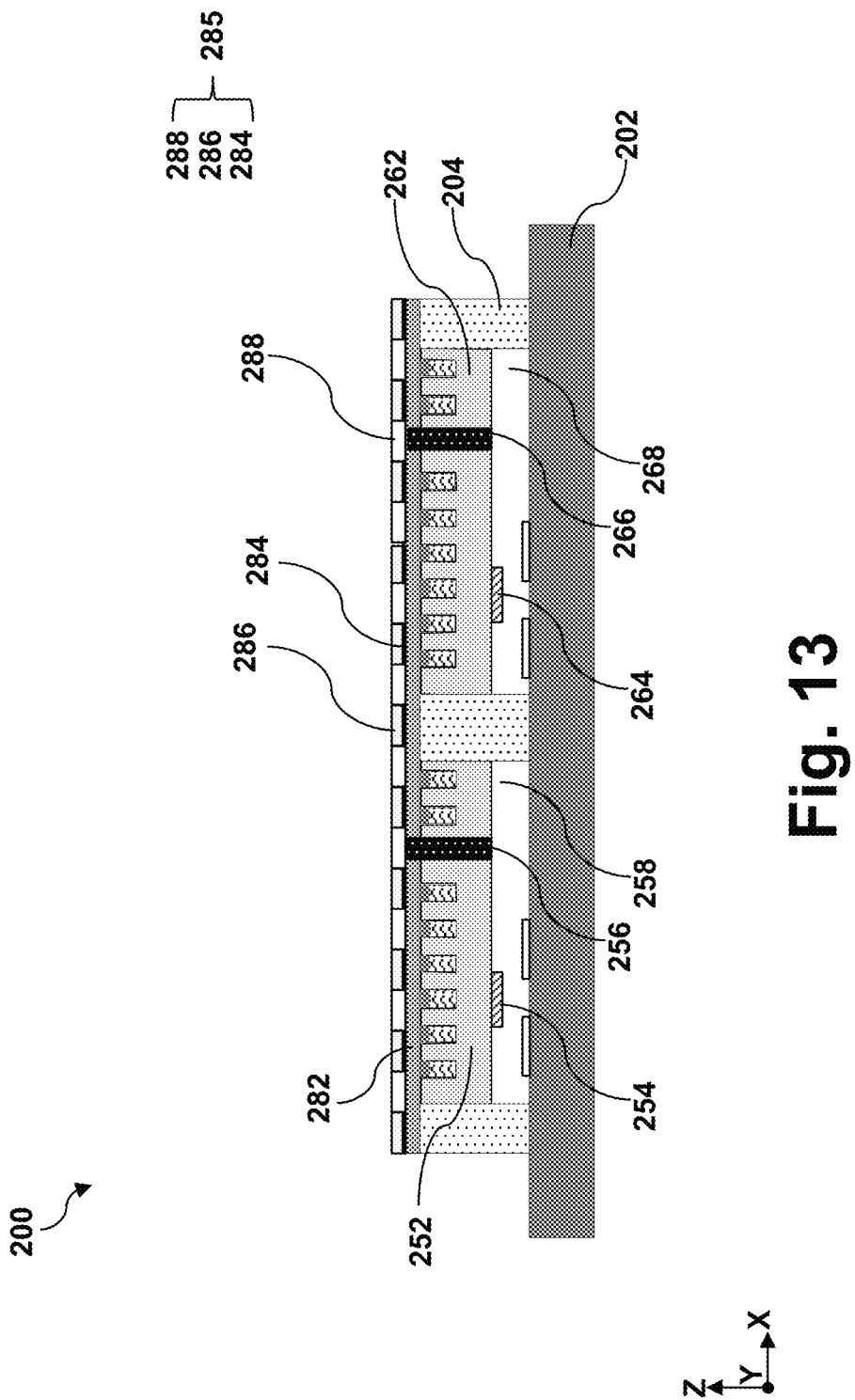

Referring to FIGS. 1 and 13, method 100 includes a block 118 where a bonding layer 285 is formed over the first die 250 and the second die 260. One of the functions of the bonding layer 285 is to provide an aligned communication interface. The first die 250 and the second die 260 may have different contact point patterns from the dies to be bonded over the first die 250 and the second die 260. The bonding layer 285 redirects patterns of the contact points of the first die 250 and the second die 260 such that they can align with contact points of the dies that are to be stacked over the first die 250 and the second die 260. Additionally, the bonding layer 285 allows the first die 250 and the second die 260 to be bonded to the overlying dies by direct bonding. Direct bonding requires a high level of surface planarity and a high density of dummy and functional bonding metal features. The bonding layer 285 is configured to be planar and include necessary dummy metal features. Referring to FIG. 13, the bonding layer 285 includes an etch stop layer (ESL) 284, an intermetal dielectric (IMD) layer 286, and a plurality of metal features 288 disposed in and extending through the ESL 284 and the IMD layer 286. The ESL 284 may include silicon nitride or silicon oxynitride. The IMD layer 286 may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide. The plurality of metal features 288 may include copper (Cu), tantalum (Ta), nickel (Ni), cobalt (Co), aluminum (Al), a combination thereof, or an alloy thereof. In one embodiment, the plurality of metal features 288 may include copper (Cu). To form the bonding layer 285, the ESL 284 is first deposited over the first workpiece 200 using CVD. Then the IMD layer 286 is deposited over the ESL 284 using CVD, flowable CVD (FCVD), or spin-on coating. Openings are then formed through the ESL 284 and the IMD layer 286. A metal fill layer is then deposited in the openings. After excess metal fill layer is removed using CMP, the plurality of metal features 288 are formed.

Figure 14:
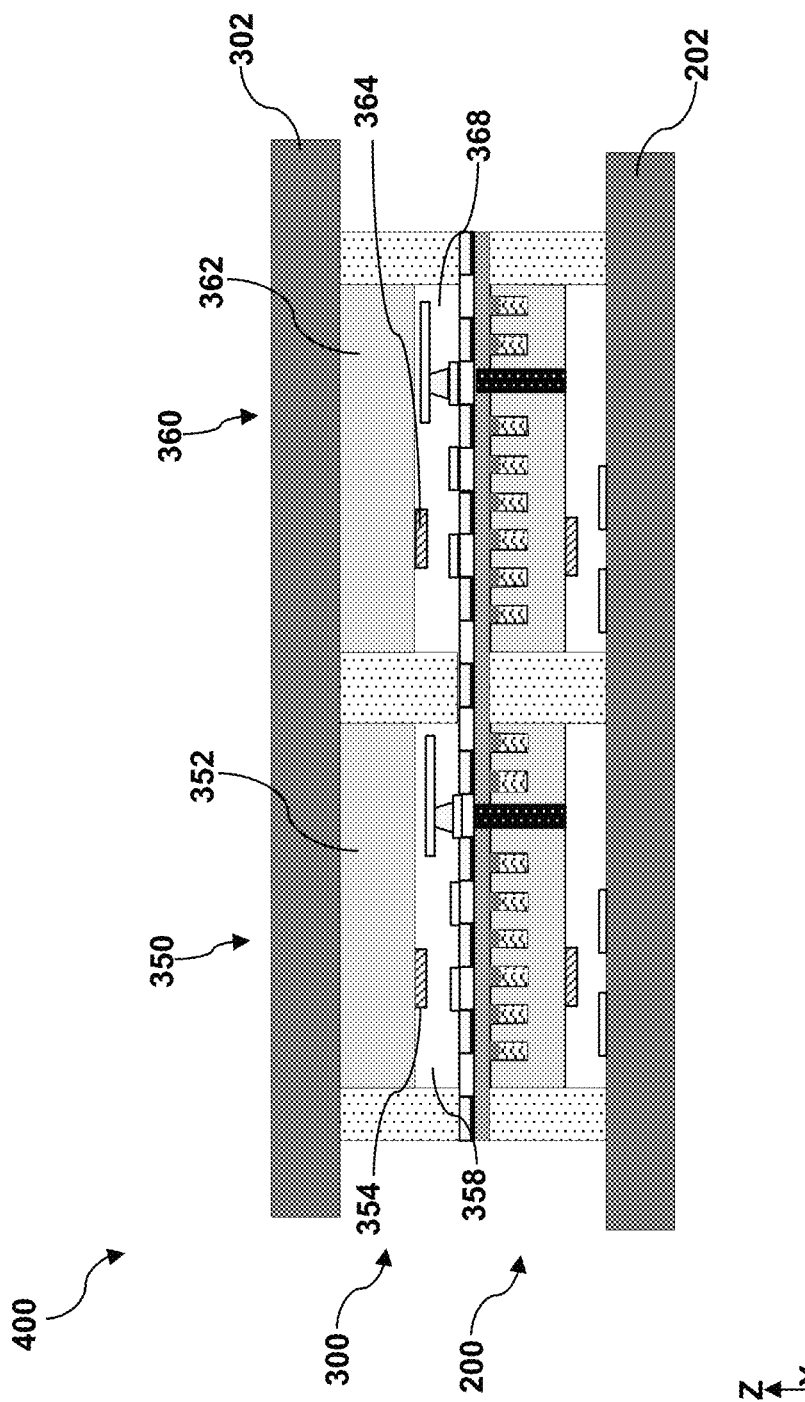

Referring to FIGS. 1 and 14, method 100 includes a block 120 where a second workpiece 300 is bonded to the first workpiece 200 to form a third workpiece 400. In some embodiments, the second workpiece 300 includes a third die 350 and a fourth die 360 mounted on a second carrier substrate 302 similar to the first carrier substrate 202. It should be understood that the second workpiece 300 shown in FIG. 14 is only an example and the second workpiece 300 may include only one die or more than two dies depending on the design needs. Each of the third die 350 and the fourth die 360 may be a logic die, a system-on-chip (SOC) die, a memory die (e.g., a dynamic random access memory (DRAM) die). The third die 350 includes a third substrate 352, a third transistor 354 formed on the third substrate 352, and a third interconnect structure 358. The third interconnect structure 358 is disposed on a front surface of the third substrate 352. It is noted that the third die 350 includes more transistors than just the third transistor 354. For ease of illustration and explanation, figures of the present disclosure only show the third transistor 354. Similarly, the fourth die 360 includes a fourth substrate 362, a fourth transistor 364 formed on the fourth substrate 362, and a fourth interconnect structure 368. The fourth interconnect structure 368 is disposed on a front surface of the fourth substrate 362. It is noted that the fourth die 360 includes more transistors than just the fourth transistor 364. For ease of illustration and explanation, figures of the present disclosure only show the fourth transistor 364.

At block 120, the second workpiece 300 is flipped upside down and bonded to the first workpiece 200 to define a third workpiece 400 or a multi-tier semiconductor structure 400. Although not explicitly shown in the figures, the second workpiece 300 may also include a bonding layer with metal features corresponding to those in the bonding layer 285. To ensure a strong bonding between the bonding layers, surfaces of the two bonding layers are cleaned to remove organic and metallic contaminants. In an example process, a sulfuric acid hydrogen peroxide mixture (SPM), a mixture of ammonium hydroxide and hydrogen peroxide (SC1), or both may be used to remove organic contaminants on the bonding layers. A mixture of hydrochloric acid and hydrogen peroxide (SC2) may be used to remove metallic contaminants. Besides cleaning, the bonding surfaces of the two bonding layers may be treated by an argon plasma or a nitrogen plasma to activate the surfaces thereof. After the bonding layers are vertically aligned, an anneal is performed to promote the van der Waals force bonding of the IMD layers as well as the surface-activated bonding (SAB) of the metal features in the bonding layers. In some instances, the anneal includes a temperature between about 200° C. and about 300°.

Figure 15:
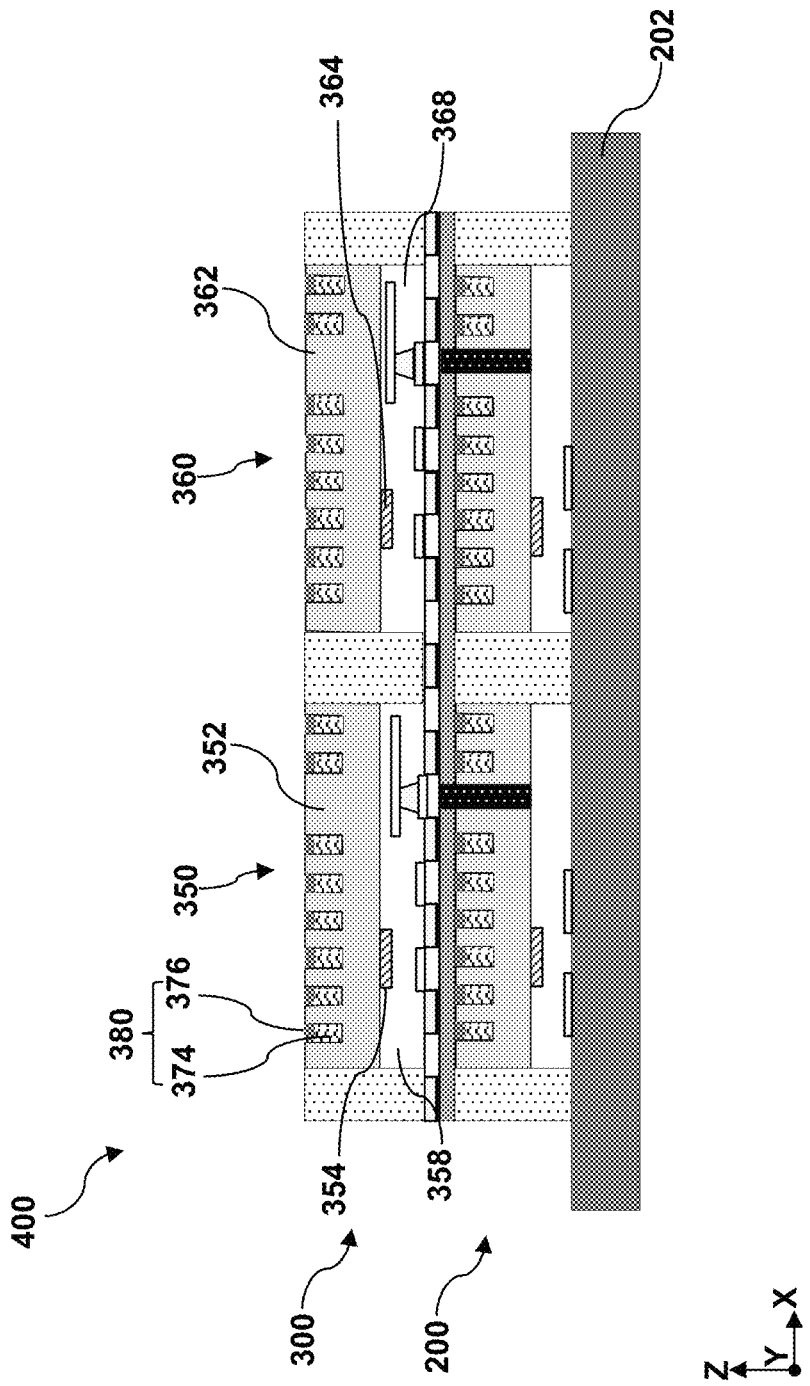

Referring to FIGS. 1 and 15, method 100 includes a block 122 where the second carrier substrate 302 is removed and operations at blocks 108, 110 and 112 are performed to the second workpiece 300. After the second workpiece 300 is bonded to the first workpiece 200 at block 120, the second carrier substrate 302 is removed to expose surfaces of the third substrate 352 and the fourth substrate 362. With the third substrate 352 and the fourth substrate 362 exposed, operations similar to those described at blocks 108, 110, and 112 may be performed to the second workpiece 300 to form second heat distribution features 380. Similar to the first heat distribution features 280, each of the second heat distribution features 380 includes liquid 374 sealed in a trench by a sealing layer 376. As described above, in some alternative embodiments, the liquid 374 and the sealing layer 376 may be replaced with a highly thermally conductive metal, such as aluminum (Al). As the materials and formation of the liquid 374 and the sealing layer 376 are similar to those for the liquid 274 and the sealing layer 276, detailed description thereof are omitted for brevity.

Figure 16:
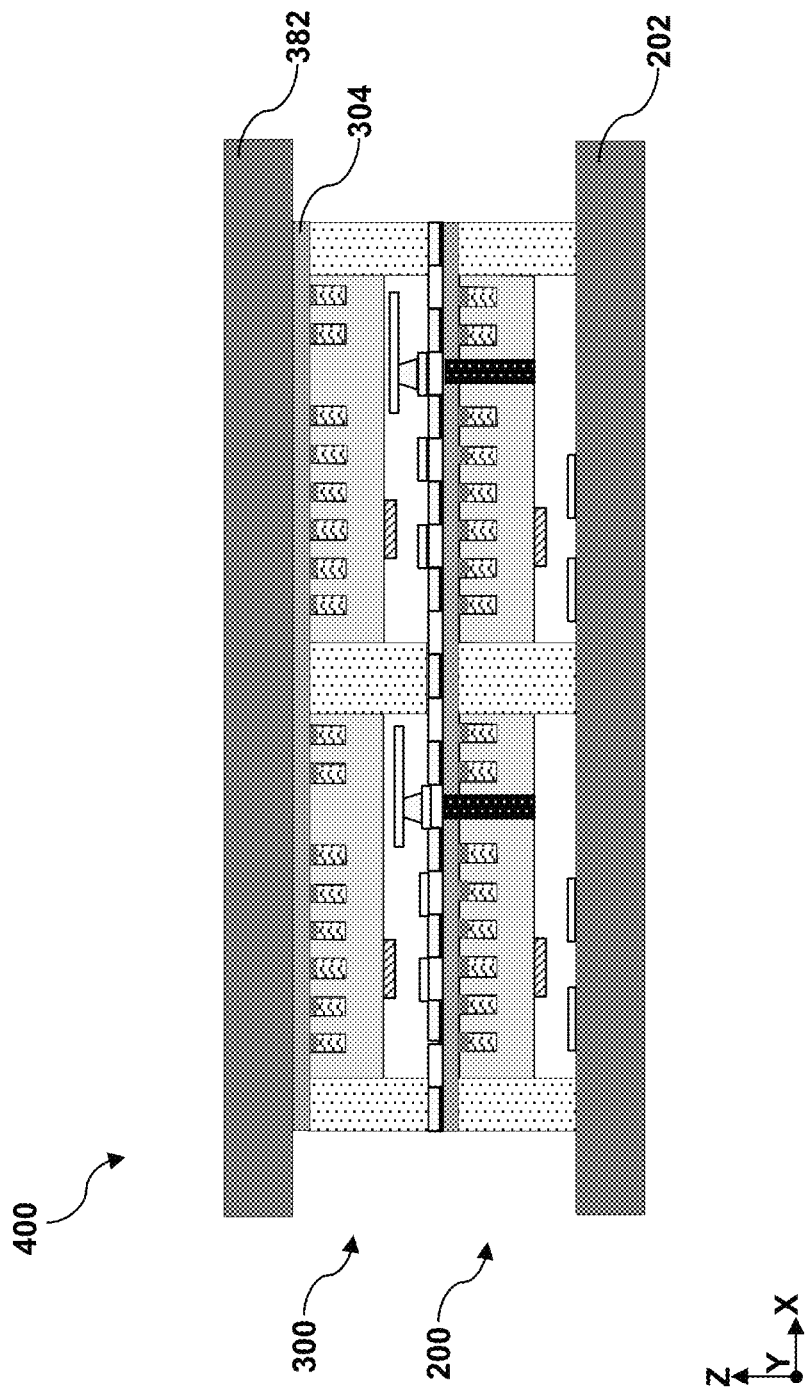
Figure 17:
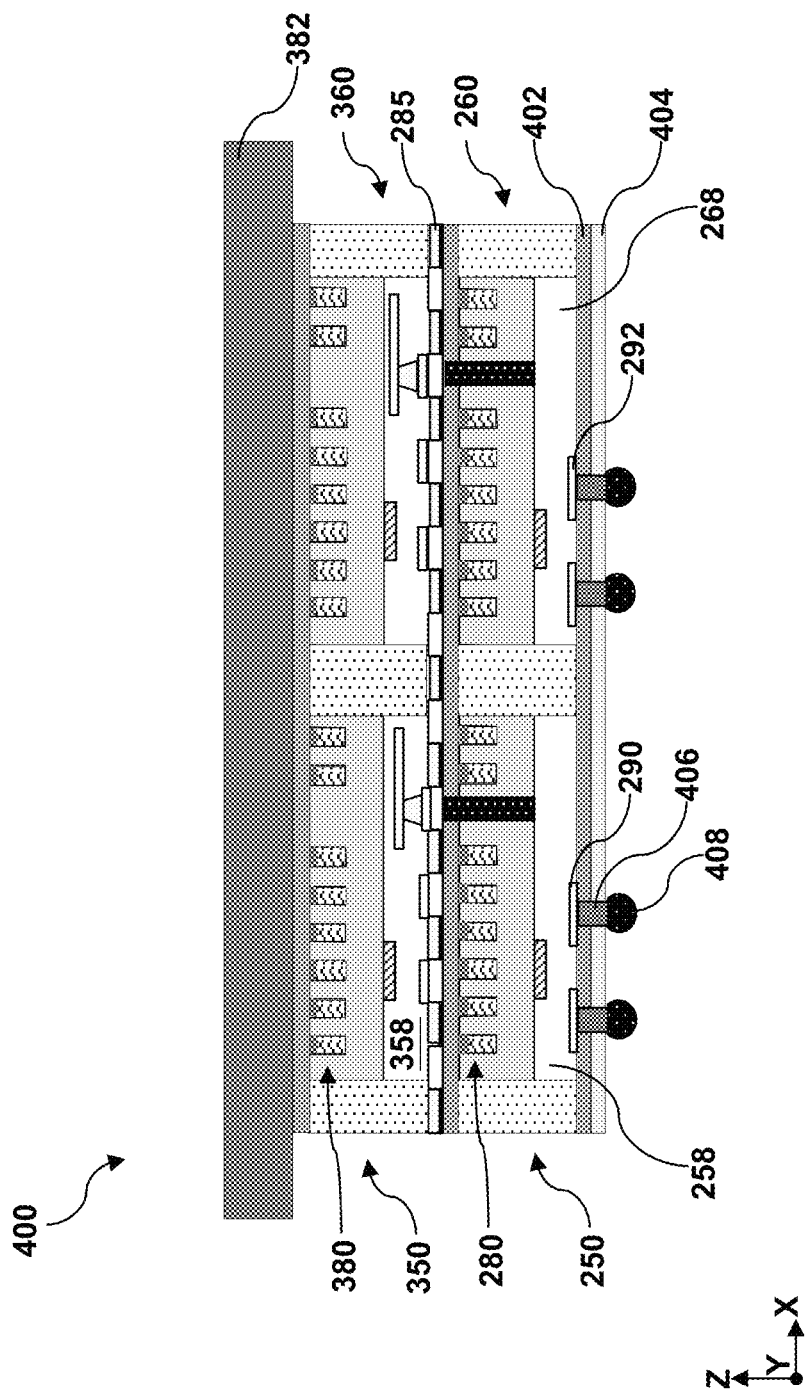

Referring to FIGS. 1, 16 and 17, method 100 includes a block 124 where further processes are performed. Such further processes may include bonding the third workpiece 400 to a third carrier substrate 382, removal of the first carrier substrate 202, and formation of bump features. In some embodiments represented in FIG. 16, an isolation layer 304 similar the isolation layer 282 may be formed over the second workpiece 300. The third carrier substrate 382 may have the same composition as the first carrier substrate 202. In some implementations, the third carrier substrate 382 may include silicon or glass. To bond the third carrier substrate 382 to the second workpiece 300, a silicon-oxide-containing layer is formed over the third carrier substrate 382 and the isolation layer 304 may be directly bonded to the silicon-oxide-containing layer. In an alternative embodiment, a die attached film may be used to bond the third carrier substrate 382 to the second workpiece 300. In order to form bump features over the front side surface (facing down in FIG. 16) of the first workpiece 200, the first carrier substrate 202 is removed using a die separation or debonding process. Reference is now made to FIG. 17. Before bump features are formed to couple to first contact pads 290 in the first interconnect structure 258 and second contact pads 292 in the second interconnect structure 268, a first passivation layer 402 and a second passivation layer 404 are deposited over the front surface of the first workpiece 200 (now part of the flipped down third workpiece 400). In some embodiments, the first passivation layer 402 may include silicon oxide, silicon nitride, silicon oxynitride, or a combination thereof and may be deposited using CVD. The second passivation layer 404 may be a polymer layer. In some instances, the second passivation layer 404 may include an epoxy, polyimide, benzocyclobutene (BCB), polybenzoxazole (PBO), or a suitable polymeric material. The second passivation layer 404 may be deposited using CVD, FCVD, or spin-on coating.

The first passivation layer 402 and the second passivation layer 404 may be collectively referred to as a passivation structure. After the formation of the passivation structure, openings directly over the first contact pads 290 and the second contact pads 292 are formed through the passivation structure. Copper posts 406 are then formed in the openings to couple to the first contact pads 290 and the second contact pads 292. The copper posts 406 may include copper (Cu), nickel (Ni), cobalt (Co), or a copper alloy. While not explicitly shown in the figure, an under-bump-metallization (UBM) may be formed before the formation of the copper post 406. The UBM layer may include a barrier layer and a seed layer. The barrier layer may include titanium nitride or tantalum nitride. The seed layer may include copper (Cu), silver (Ag), chromium (Cr), tin (Sn), gold (Au), and combinations thereof. After the formation of the copper posts 406, bump features 408 are formed on the copper posts 406. The bump features 408 may include a Sn—Cu alloy, a Sn—Ag alloy, or a Sn—Cu—Ag alloy. The bump features 408 may be Controlled Collapse Chip Connection (C4) connections or microbumps.

In one exemplary aspect, the present disclosure is directed to a semiconductor structure. The semiconductor structure includes a first interconnect structure, a first substrate disposed on the first interconnect structure, a second interconnect structure disposed on the first substrate, and a second substrate disposed on the second interconnect structure. The first substrate includes a first plurality of trenches extending from a surface adjacent the second interconnect structure into the first substrate. The first plurality of trenches are filled with a liquid.

In some embodiments, the liquid includes water, hydrocarbons, or fluorocarbons. In some implementations, the second substrate includes a second plurality of trenches extending from a surface away from the second interconnect structure into the second substrate. The second plurality of trenches are filled with the liquid. In some embodiments, the first substrate further includes at least one through-substrate-via (TSV) that extends completely through the first substrate. In some instances, the first plurality of trenches are further filled with a sealing layer and a top surface of the sealing layer is coplanar with a top surface of the first substrate. In some embodiments, the semiconductor structure further includes a dielectric structure surrounding and in contact with the first interconnect structure and the first substrate and an isolation film disposed on the first substrate, the sealing layer, and the dielectric structure. In some instances, the semiconductor structure further includes a dielectric layer disposed on the isolation film, and a plurality of contact features embedded in the dielectric layer. In some embodiments, the sealing layer includes silicon nitride.

In another exemplary aspect, the present disclosure is directed to a semiconductor structure. The semiconductor structure includes a first die, a bonding layer, and a second die. The first die includes a first interconnect structure, a first substrate disposed on the first interconnect structure, and a first plurality of heat distribution lines disposed in the first substrate. The bonding layer is disposed over the first substrate. The second die is disposed on the bonding layer and includes a second interconnect structure, a second substrate disposed on the second interconnect structure, and a second plurality of heat distribution lines disposed in the second substrate.

In some embodiments, each of the first plurality of heat distribution lines and the second plurality of heat distribution lines includes a liquid and a sealing layer over the liquid. In some embodiments, the sealing layer includes silicon oxide, silicon nitride, or silicon. In some implementations, the bonding layer includes a first plurality of metal features. The second interconnect structure includes a second plurality of metal features. Each of the first plurality of metal features is vertically aligned with one of the second plurality of metal features. In some instances, each of the first plurality of heat distribution lines and the second plurality of heat distribution lines includes a metal. In some embodiments, the metal includes aluminum (Al).

In yet another exemplary aspect, the present disclosure is directed to a method. The method includes receiving a first workpiece that includes a first die mounted on a first carrier substrate, the first die including a first substrate and a through-substrate via (TSV), selectively etching the first substrate until a portion of the TSV rises above the first substrate, forming a first plurality of trenches in the first substrate, injecting a liquid into the first plurality of trenches, depositing a first sealing layer over the first workpiece to seal the liquid in the first plurality of trenches, and after the depositing of the first sealing layer, planarizing the first workpiece to expose the TSV.

In some embodiments, the first sealing layer includes silicon oxide, silicon nitride, or silicon. In some implementations, the forming of the first plurality of trenches includes use of a mechanical saw. In some embodiments, the forming of the first plurality of trenches includes use of a laser saw. In some instances, the method further includes bonding on the first workpiece a second workpiece that includes a second die mounted on a second carrier substrate, the second die including a second substrate, removing the second carrier substrate, after the removing of the second carrier substrate, forming a second plurality of trenches in the second substrate, injecting the liquid into the second plurality of trenches, depositing a second sealing layer over the second workpiece to seal the liquid in the second plurality of trenches, and after the depositing of the second sealing layer, planarizing the second workpiece. In some embodiments, the method further includes after the planarizing the second workpiece, depositing an isolation layer over the second workpiece, and bonding a third carrier substrate to the isolation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
   a first interconnect structure;
   a first substrate disposed on the first interconnect structure;
   a second interconnect structure disposed on the first substrate; and
   a second substrate disposed on the second interconnect structure,
   wherein the first substrate comprises a first plurality of trenches extending from a surface adjacent the second interconnect structure into the first substrate,
   wherein the first plurality of trenches is partially filled with a liquid.
2. The semiconductor structure of claim 1, wherein the liquid comprises water, hydrocarbons, or fluorocarbons.
3. The semiconductor structure of claim 1,
   wherein the second substrate comprises a second plurality of trenches extending into the second substrate from a surface that faces away from the second interconnect structure,
   wherein the second plurality of trenches is partially filled with the liquid.
4. The semiconductor structure of claim 3, wherein the first substrate further comprises at least one through-substrate-via (TSV) that extends completely through the first substrate.
5. The semiconductor structure of claim 3,
   wherein the first plurality of trenches is further filled with a sealing layer such that the liquid and the sealing layer substantially fill the first plurality of trenches,
   wherein a top surface of the sealing layer is coplanar with a top surface of the first substrate.
6. The semiconductor structure of claim 5, further comprising:
   a dielectric structure surrounding and in contact with the first interconnect structure and the first substrate; and
   an isolation film disposed on the first substrate, the sealing layer, and the dielectric structure.
7. The semiconductor structure of claim 6, further comprising:
   a dielectric layer disposed on the isolation film; and
   a plurality of contact features embedded in the dielectric layer.
8. The semiconductor structure of claim 6, wherein the sealing layer comprises silicon nitride.
9. A semiconductor structure, comprising:
   a first die comprising:
      a first interconnect structure,
      a first substrate disposed on the first interconnect structure, and
      a first plurality of heat distribution lines disposed in the first substrate;
   a bonding layer disposed over the first substrate; and
   a second die disposed on the bonding layer and comprising:
      a second interconnect structure,
      a second substrate disposed on the second interconnect structure, and
      a second plurality of heat distribution lines disposed in the second substrate.
10. The semiconductor structure of claim 9, wherein each of the first plurality of heat distribution lines and the second plurality of heat distribution lines comprises a liquid and a sealing layer over the liquid.
11. The semiconductor structure of claim 10, wherein the sealing layer comprises silicon oxide, silicon nitride, or silicon.

12. The semiconductor structure of claim 9,
wherein the bonding layer comprises a first plurality of metal features,
wherein the second interconnect structure comprises a second plurality of metal features,
wherein each of the first plurality of metal features is vertically aligned with one of the second plurality of metal features.

13. The semiconductor structure of claim 9, wherein each of the first plurality of heat distribution lines and the second plurality of heat distribution lines comprises a metal.

14. The semiconductor structure of claim 13, wherein the metal comprises aluminum (Al).

15. A method, comprising:
receiving a first workpiece that includes a first die mounted on a first carrier substrate, the first die comprising a first substrate and a through-substrate via (TSV);
selectively etching the first substrate until a portion of the TSV rises above the first substrate;
forming a first plurality of trenches in the first substrate;
injecting a liquid into the first plurality of trenches;
depositing a first sealing layer over the first workpiece to seal the liquid in the first plurality of trenches; and
after the depositing of the first sealing layer, planarizing the first workpiece to expose the TSV.

16. The method of claim 15, wherein the first sealing layer comprises silicon oxide, silicon nitride, or silicon.

17. The method of claim 15, wherein the forming of the first plurality of trenches comprises use of a mechanical saw.

18. The method of claim 15, wherein the forming of the first plurality of trenches comprises use of a laser saw.

19. The method of claim 15, further comprising:
bonding on the first workpiece a second workpiece that includes a second die mounted on a second carrier substrate, the second die comprising a second substrate;
removing the second carrier substrate;
after the removing of the second carrier substrate, forming a second plurality of trenches in the second substrate;
injecting the liquid into the second plurality of trenches;
depositing a second sealing layer over the second workpiece to seal the liquid in the second plurality of trenches; and
after the depositing of the second sealing layer, planarizing the second workpiece.

20. The method of claim 19, further comprising:
after the planarizing the second workpiece, depositing an isolation layer over the second workpiece; and
bonding a third carrier substrate to the isolation layer.

* * * * *